United States Patent
Gasbarro et al.

(10) Patent No.: US 7,099,152 B2
(45) Date of Patent: Aug. 29, 2006

(54) COMPUTER SYSTEM WITH CONFIGURABLE DOCKING STATION

(75) Inventors: Henry Frank Gasbarro, Marina del Rey, CA (US); Harry Neil Campbell, Yorba Linda, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 53 days.

(21) Appl. No.: 10/647,960

(22) Filed: Aug. 26, 2003

(65) Prior Publication Data
US 2005/0047079 A1 Mar. 3, 2005

(51) Int. Cl.
*G06F 1/16* (2006.01)

(52) U.S. Cl. .................. 361/686; 710/304; 312/223.3; 439/929

(58) Field of Classification Search ........ 361/679–686, 361/724–727; 710/102, 303, 304; 16/223; 312/223.1–223.3; 439/310, 374, 929
See application file for complete search history.

(56) References Cited

U.S. PATENT DOCUMENTS

| | | | |
|---|---|---|---|
| 5,680,126 A | 10/1997 | Kikinis | 341/22 |
| 5,768,100 A | 6/1998 | Barrus et al. | 364/708.1 |
| 5,825,617 A | 10/1998 | Kochis et al. | |
| 6,023,587 A | 2/2000 | Watts, Jr. et al. | |
| 6,101,087 A | 8/2000 | Sutton et al. | 361/686 |
| 6,141,221 A * | 10/2000 | Tong et al. | 361/686 |
| 6,157,958 A | 12/2000 | Armitage et al. | 709/250 |
| 6,195,670 B1 | 2/2001 | Freeny | 708/100 |
| 6,231,371 B1 * | 5/2001 | Helot | 439/374 |
| 6,246,575 B1 | 6/2001 | Barrus et al. | 361/686 |
| 6,297,963 B1 | 10/2001 | Fogle | |
| 6,307,750 B1 | 10/2001 | Bendikas et al. | |
| 6,331,934 B1 * | 12/2001 | Helot et al. | 361/686 |
| 6,341,320 B1 | 1/2002 | Watts, Jr. et al. | |
| 6,366,458 B1 * | 4/2002 | Yoshida et al. | 361/686 |
| 6,377,981 B1 | 4/2002 | Ollikainen et al. | 709/217 |
| 6,426,872 B1 | 7/2002 | Sutton et al. | 361/686 |
| 6,442,639 B1 | 8/2002 | McElhattan et al. | |
| 6,522,532 B1 * | 2/2003 | Liao et al. | 361/686 |
| 6,539,484 B1 | 3/2003 | Cruz | |

(Continued)

FOREIGN PATENT DOCUMENTS

CA 2 441 070 A1 3/2002

(Continued)

OTHER PUBLICATIONS

Preliminary British search report for Application No. GB 0417164.1, by Examiner: Saskia Jonkhart, Claims researched: 1-17, 31-37, Date of search Dec. 16, 2004.

(Continued)

*Primary Examiner*—Hung Van Duong
(74) *Attorney, Agent, or Firm*—Tarolli, Sundheim, Covell & Tummino LLP (57) ABSTRACT

A system includes a computer having at least one power input connection and at least one I/O connection grouped into a first port. The system also includes a docking station that has at least one power output connection and at least one I/O connection grouped into a second port. The system further comprises a cable having a first end connectable with the first port and a second end connectable with the second port. The cable provides an interconnection between the at least one power output connection of the docking station and the at least one power input connection of the computer. The cable also provides interconnection between the at least one I/O connection of the computer and the at least one I/O connection of the docking station.

26 Claims, 8 Drawing Sheets

U.S. PATENT DOCUMENTS

| | | |
|---|---|---|
| 6,547,569 B1 | 4/2003 | Issaa |
| 6,683,786 B1 * | 1/2004 | Yin et al. .................. 361/686 |
| 6,765,792 B1 * | 7/2004 | Yin et al. .................. 361/686 |
| 2003/0135681 A1 | 7/2003 | Laity et al. |

FOREIGN PATENT DOCUMENTS

| | | |
|---|---|---|
| EP | 1293876 A1 | 3/2003 |
| WO | WO 01/88652 A3 | 11/2001 |

OTHER PUBLICATIONS

Search and Examination Report for corresponding British patent application No. GB0417164.1 dated Dec. 6, 2005.

Examiner's First Report for corresponding Austrialian patent application 2004203655 mailed Jan. 31, 2006.

* cited by examiner

COMPUTER SYSTEM WITH CONFIGURABLE DOCKING STATION

TECHNICAL FIELD

The present invention relates generally to electronics and, more particularly, to a computer system with a configurable docking station.

BACKGROUND OF THE INVENTION

Computer systems have become increasingly involved in a variety of applications. Much of this involvement can be attributed to the increasingly portable nature of modern computer systems. Computer systems, such as notebook, laptop, and handheld computers, provide their users with quick and easy mobile access to a vast amount of data. Among those who benefit from these portable computer systems are those involved in public safety, such as police, fire and rescue personnel. Others who benefit in a civil or commercial sense are field personnel, such as engineers or technicians, who rely on portable computer systems to perform testing, monitoring, evaluation etc. in a variety of remote or off-site locations. Still others who benefit from this technology are those involved in national defense, such as military personnel, who use systems, such as battlefield digitization computers (BDCs) to provide situational awareness and command and control information to personnel operating mobile units, such as tactical vehicles, aviation, and weapon platforms.

In many instances, portable computer systems use commercial off-the-shelf (COTS) electronics products, which are post-engineered or customized to provide user specific functionality. For example, portable computer systems may be post-engineered to meet environmental conditions or may be fitted or retrofitted with hardware and software to include a desired set of peripherals, such as global positioning system (GPS) functionality, radio/satellite communications, wireless networking (e.g., Internet) capability, communication and I/O compatibility (e.g., RS-232, RS-422, Ethernet, USB), and video (e.g., SVGA) compatability. A major benefit of COTS products is that they are non-developmental items that allow rapid proof-of-concept demonstration and system development.

When embedded into specialized systems, COTS items may have been modified to the point that any attempt to follow technology migration (e.g., faster processor, faster bus speed, and new memory type) may result in significant nonrecurring engineering (NRE) costs. The proliferation of technology, rate of COTS product evolution, advancement of system requirements, and realities of program budgets are all driving and complicating factors in this process.

A major cost driver in system design, whether from the ground up or using COTS assemblies, is in initial fielding and future updating of the system to the latest available technology. This may be especially true when the system is mounted in or on a specialized installation platform. For example, on a military vehicle installation platform, a BDC system may include a display unit, a keyboard, and a processor unit mounted in the vehicle with cables connecting the display unit to the processor unit and to the keyboard. External peripherals, such as an Internet controller, GPS module, radio and/or satellite communications, and various other task-specific hardware, such as sensors require mounting space on the platform and external cabling to provide power and communications. Considering that different installation platforms (e.g., vehicle types) have different architectures and may require different or unique capabilities, space (e.g., footprint space) on the installation platform may be at a premium, installations may be complex, and changes, maintenance, and upgrades to the system or its architecture may prove difficult and costly. Also, the personnel occupying any given vehicle may have different needs and therefore may require different combinations of hardware.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor delineate the scope of the invention. Its sole purpose is to present some concepts of the invention in a simplified form as a prelude to the more detailed description that is presented later.

The present invention relates to a system for implementing computer hardware, software, and peripherals. The system includes computer resources required to run application specific software and also has sufficient room for expansion such that related peripheral systems may be physically contained within the form factor of the system. The system includes a computer and a docking station interconnected with the computer by a cable. The docking station architecture provides a task or user specific functionality through customizable and interchangeable interface standards (e.g., mezzanine board technology, such as a PC/104 platform), which also provide the flexibility to support current and future peripherals and data interfaces. The type of computer (e.g., notebook PC, tablet PC, handheld PC) may vary depending on the application without requiring alteration of the docking station.

According to one aspect of the present invention, the computer is powered by the docking station through a cable and provides super video graphics array (SVGA), universal serial bus (USB), and communications, such as Ethernet, RS-422, and RS-232, via the docking station. The computer supports device inputs for a keyboard, an optional input device (e.g., a mouse), and an audio output connector. The docking station, in addition to providing power to the computer, may provide connectivity to the peripherals, communication, and sensors on the vehicle/platform. The docking station may also provide the present and future interfaces that are not provided by the computer. The docking station may further contain the electronics required to support the interfaces communicating with the computer via the communication interfaces.

The docking station may include connectors, such as pin-type passthrough bulkhead connectors, that form I/O ports on the docking station for facilitating quick additions of functions through the installation of cables and modules into the docking station while in the field. The system architecture may accommodate additional features, such as speech recognition, biometric security/log-on devices, wireless support, additional data interfaces, and expanded USB support. For these additional features, the docking station mat provide the power and space required for the electronics needed to provide any or all of this increased functionality.

According to one aspect of the present invention, a system includes a computer having at least one power input connection and at least one I/O connection grouped into a first port. The system also includes a docking station that has at least one power output connection and at least one I/O connection grouped into a second port. The system further comprises a cable having a first end connectable with the first port and a second end connectable with the second port. The cable provides an interconnection between the at least one power output connection of the docking station and the at least one power input connection of the computer. The cable also provides interconnection between the at least one I/O connection of the computer and the at least one I/O connection of the docking station.

According to another aspect of the present invention, a system includes a docking station including a plurality of I/O ports, each I/O port being terminated with an I/O port connector. The system also includes at least one module supported in the docking station. The docking station modules have I/O connections terminated with module I/O connectors. The module I/O connectors are connectable with a selected one of the I/O port connectors to configure the module I/O connections to communicate through the selected I/O port.

According to another aspect of the present invention, a system includes a computer having at least one I/O connection provided to a first port and a docking station having a second port and at least one I/O port. The system also includes a cable having a first end connectable with the first port and a second end connectable with the second port. The cable provides an interconnection between the at least one I/O connection of the computer and the second port of the docking station. The system further includes a connector for providing interconnection between the second port and a selected I/O port of the docking station to provide I/O from an external device connected to the selected I/O port to the at least one I/O connection of the computer via the cable.

According to another aspect of the present invention, a system includes a docking station including a plurality of I/O ports, each I/O port being terminated with an I/O port connector. The system also includes a module stack supported in the docking station. The module stack includes a plurality of modules having I/O connections terminated with module I/O connectors. The module I/O connectors are connectable with a selected one of the I/O port connectors to configure the module I/O connections to communicate through the selected I/O port.

According to another aspect of the present invention, a method for configuring a computer system includes the step of providing a computer having a power input connection and at least one I/O connection. Next, the power input connection and I/O connections of the computer are grouped into a first port. Next, a docking station having a power output connection and at least one I/O connection is provided. Next, the power output connection and I/O connections of the docking station are grouped into a second port. Next, a first end of a cable is connected with the first port of the computer. Finally, a second end of the cable is connected with the second port of the docking station. The cable provides an interconnection between the power output connection of the docking station and the power input connection of the computer. The cable also provides interconnection between the I/O connections of the computer and the I/O connections of the docking station.

According to another aspect of the present invention, a method for configuring a computer system includes the step of providing a docking station including a plurality of I/O ports. Next, each I/O port is terminated with an I/O port connector. Next, at least one module is supported in the docking station, the modules including I/O connections. Next, the I/O connections of the module are terminated with module I/O connectors. Finally, the module I/O connectors are connected with selected ones of the I/O port connectors to selectively associate the module I/O connections with a particular I/O port.

According to another aspect of the present invention, a method for configuring a computer system comprising the step of providing a computer having at least one I/O connection linked to a first port. Next, a docking station having a second port and at least one I/O port is provided. Next, a first end of a cable is connected with the first port. Next, a second end of the cable is connected with the second port to provide an interconnection between the at least one I/O connection of the computer and the second port of the docking station. Finally, the second port and a selected I/O port of the docking station are interconnected with a connector to provide I/O from an external device connected to the selected I/O port to the at least one I/O connection of the computer via the cable.

DETAILED DESCRIPTION OF INVENTION

The present invention relates to a computer system for implementing computer hardware, software, and peripherals. The computer system includes a computer operatively connected with a configurable docking station via a cable. The docking station provides a task or user specific functionality through customizable and interchangeable interface standards and also provides the flexibility to support current and future peripherals and data interfaces. The computer provides a graphic user interface (GUI), which allows for interfacing with the various devices operating in the docking station as well as data on the computer. The docking station provides a configurable architecture in which a variety of peripheral or stand alone device may be implemented and also provides power to the computer.

Figure 1:
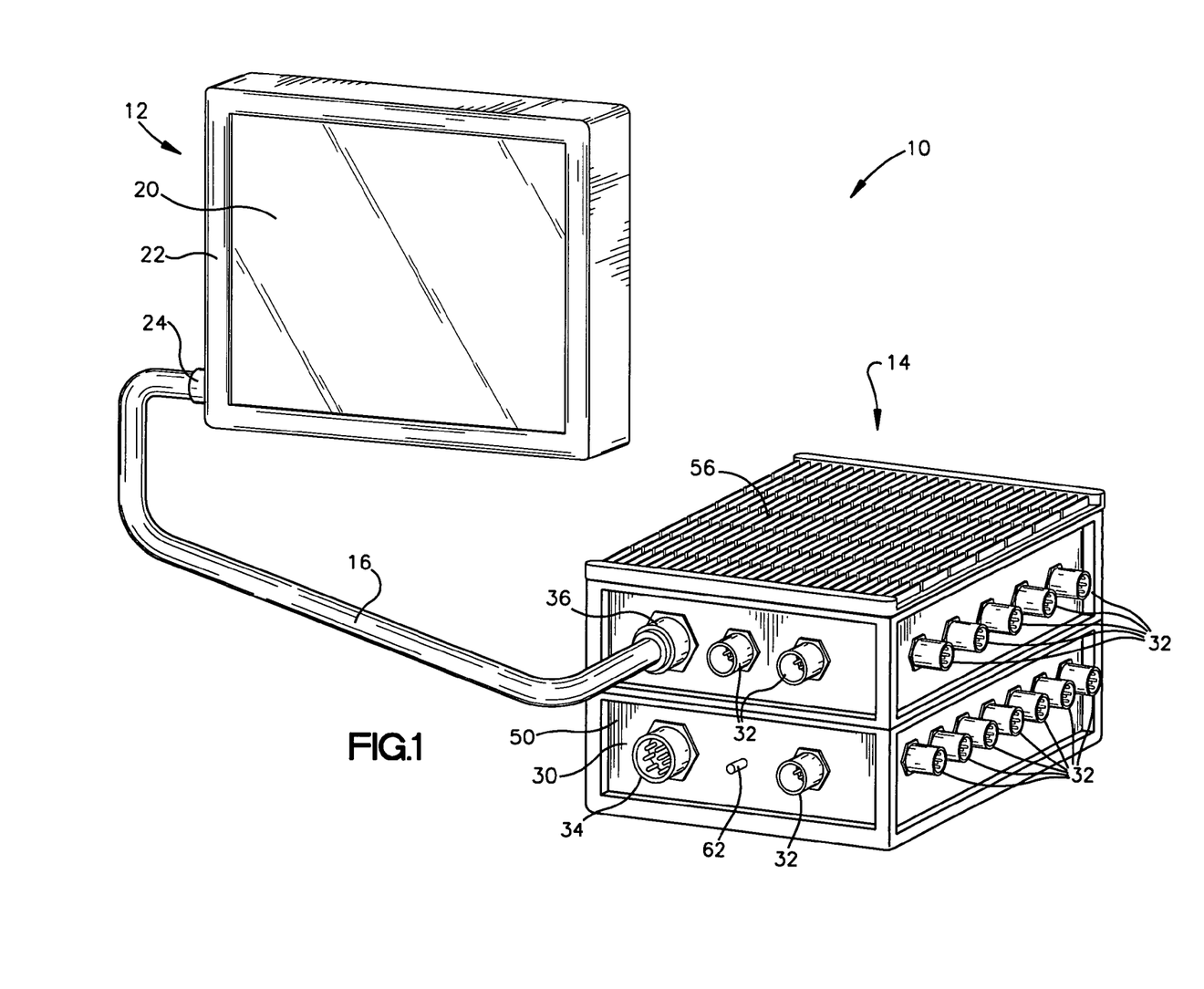
FIG. 1 illustrates a computer system with a re-configurable docking station, according to an embodiment of the present invention.

FIG. 1 illustrates a computer system 10 in accordance with one aspect of the present invention. The system 10 includes a computer 12 that is operatively connected to a docking station 14 via a cable 16. In the system 10 illustrated in FIG. 1, the computer 12 can be a tablet PC. It will be appreciated that the computer 12 could, however, take the form of a variety of computing platforms, such as a notebook computer, a handheld or palm computer, or any other suitable computing means. The computer 12 includes a display 20 viewable by a user. The computer 12 may also be adapted to receive input from a user through a variety of devices, such as a keyboard, mouse, track ball, touch pad, stylus, touch screen, voice recognition device, etc.

The computer 12 also includes a computer housing 22 that provides a structure for supporting the various components of the computer (e.g., motherboard, processor, memory, hard drive, display, etc.). Depending on the environment in which the system is to be operated, the computer housing 22 may be reinforced or "ruggedized" in order to meet any harsh or extreme environmental usage. For example, the computer housing 22 may be adapted to withstand and/or dampen shock or vibrations, to endure extreme high and/or low temperature extremes, and to be resistant to water/moisture, dirt, dust, etc.

The docking station 14 includes a housing 30 that supports a variety of components which will be described in further detail below. Similar to the computer housing 22, depending on the environment in which the system 10 is to be operated, the docking station housing 30 may be reinforced or "ruggedized" in order to meet any harsh or extreme environmental usage. For example, the housing 30 may be adapted to withstand and/or dampen shock or vibrations, to endure extreme high and/or low temperature extremes, and to be resistant to water/moisture, dirt, dust, etc.

The docking station 14 also includes a plurality of I/O ports 32 with portions presented externally of the housing 30. The I/O ports 32 may be any of a variety of known electrical connectors, such as pin-type passthrough bulkhead connectors. Also, it will be appreciated that the I/O ports 32 of the docking station 14 may comprise a plurality of different connector types. As will be described below, the I/O ports 32 allow for, among other things, providing an electrical connection between components mounted in the docking station 14 and external devices, such as antennas, receivers, sensors, other computers, etc. A power port 34 of the docking station 14 may be used to provide power from the platform upon which the system 10 is installed (e.g., a vehicle) to the docking station 14.

The cable 16 is connectable with the computer 12 through a port 24 and is connectable with the docking station 14 through an I/O and power port 36. The cable 16 performs a variety of functions, such as providing various forms of communication between the computer 12 and the docking station 14 and providing power to the computer from the docking station. These functions will be discussed in further detail below.

Figure 2:
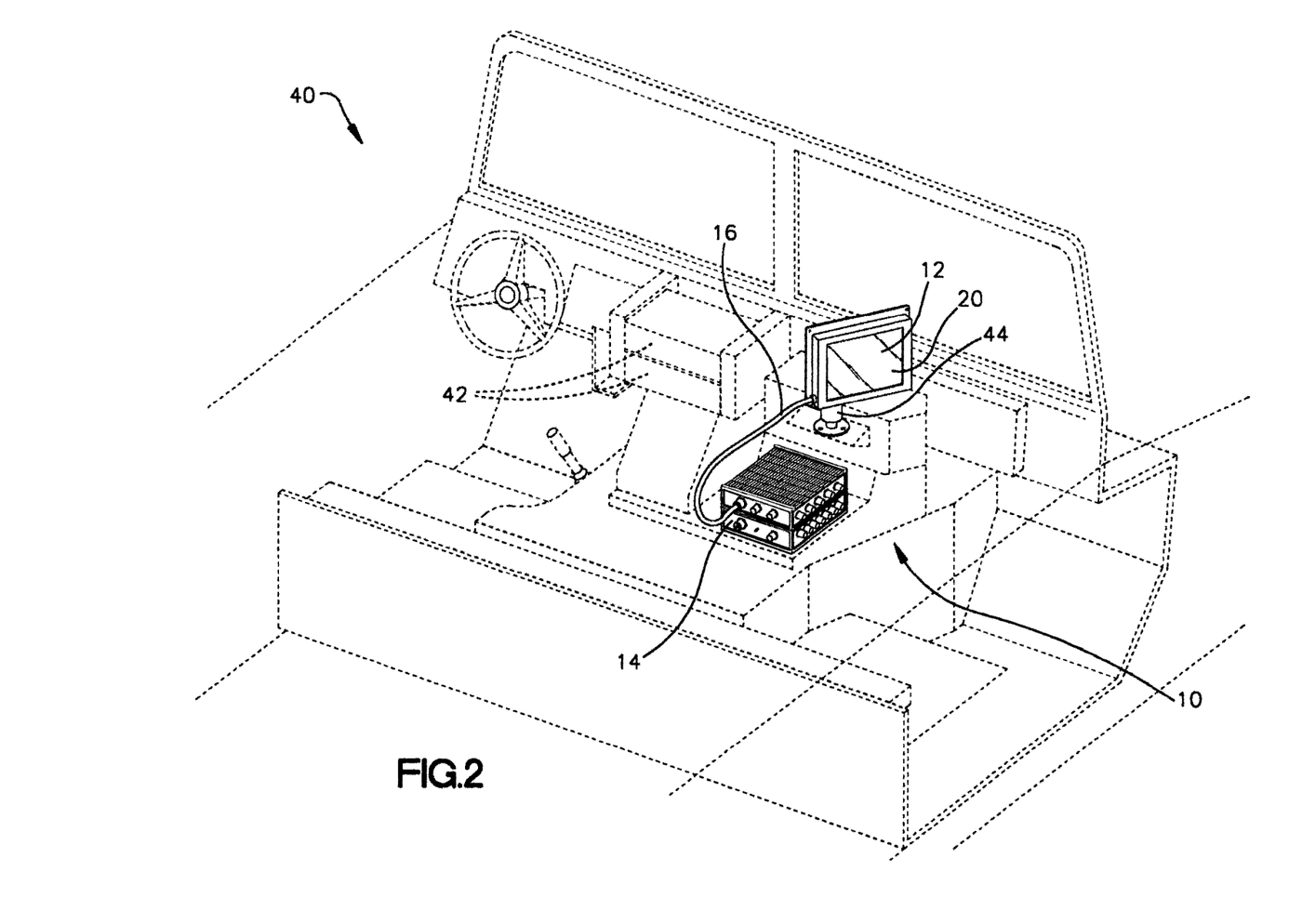
FIG. 2 illustrates the system of FIG. 1 installed in a vehicle platform.

FIG. 2 illustrates an example embodiment of the present invention in which the platform upon which the system 10 is implemented is a vehicle 40. As shown in FIG. 2, the footprint space in which the system 10 is installed is limited, as the vehicle 40 may include a variety of other equipment 42, such as radios, navigational equipment, etc. As shown in FIG. 2, the computer 12 is removably mounted on a support 44 that may have shock absorbing capabilities and may allow for moving or adjusting the computer display 20 to a desired position. In the configuration of FIG. 2, the docking station 14 is mounted near the computer 12, on a surface below the computer. It will be appreciated, however, that the docking station 14 could be mounted on the vehicle 40 at a location more remotely isolated from the computer 12. In any instance, the cable 16 may be routed in the vehicle 40 from the computer 12 to the docking station 14. The cable 16, packaging all of the necessary conductors (e.g., communications, I/O, power, etc.), facilitates a quick and simple installation of the system 10 in the vehicle 40.

Figure 3:
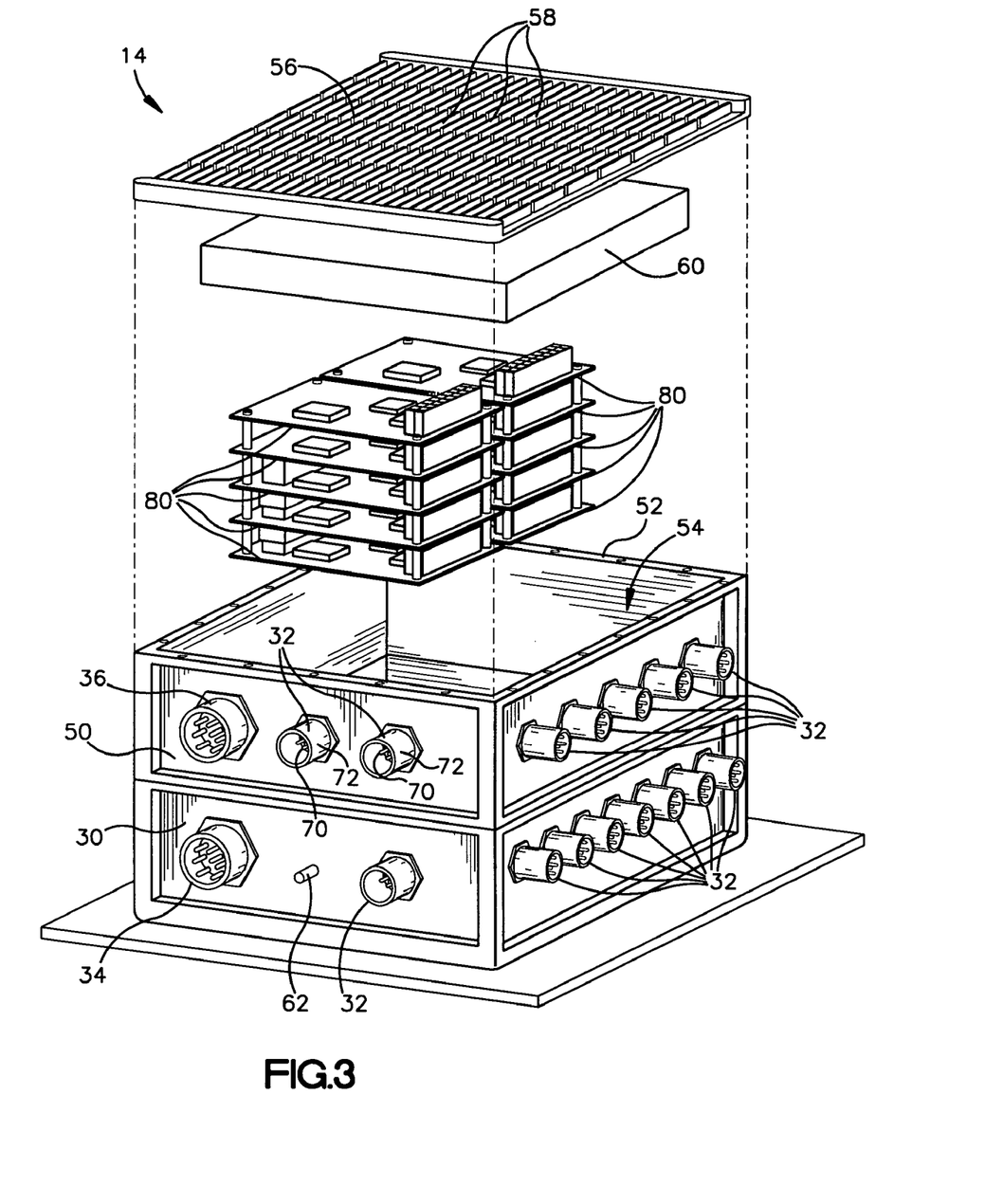
FIG. 3 is an exploded view of a docking station portion of the computer system of FIG. 1.

Referring to FIG. 3, the housing 30 of the docking station 14 includes a base 50 including a side wall 52 that helps define an interior space 54 of the docking station. The housing 30 also includes a cover 56 that may be fixed to an upper edge of the side wall 52 to enclose the interior space 54. The base 50 and/or the cover 56 may include ribs 58 that help form a heat sink for helping to dissipate heat from the docking station 14. The docking station 14 also includes a power supply 60 for distributing or otherwise providing electrical power to the devices housed in the docking station and to the computer 12 via the cable 16 (see FIG. 2). The power supply 60 may also include power conditioning capabilities. The power supply 60 is powered with external power provided to the docking station 14 through the power connector 34 (see also FIG. 5). The docking station 14 may include a switch (not shown) actuatable to switch on and off the power to the docking station, and a ground stud 62 for grounding the docking station to the vehicle chassis. In the embodiment illustrated in FIG. 3, the power supply 60 is supported on the cover 56. It will be appreciated, however, that the power supply 60 could be supported in any suitable location in or on the docking station 14.

The I/O ports 32 mounted on the docking station 14 may be of any type suited to provide the required electrical connections. In the embodiment of FIG. 3, the I/O ports 32 are pin-type passthrough bulkhead connectors that extend through the side wall 52. Each I/O port 32 includes a plurality of pins 70 that extend axially along the length of the connector and thus through the side wall 52. The pins 70 are surrounded by a shroud 72 which may serve to protect the pins against damage and as a means for connecting cables to the I/O ports 32. The I/O ports 32 facilitate connection with a mating connector (not shown in FIG. 3) that has a portion for connecting with the shroud 72 and includes female receptacles for receiving the pins 70 and establishing an electrically conductive connection between the pins and conductors of the cable. The shrouds 72 may also be grounded through the base 50 and isolated from the pins 70 such that cables connected to the I/O ports 32 may be shielded from interference.

The docking station 14 may also support a plurality of modules 80 for performing a variety of functions that will be discussed in more detail below. The modules 80 illustrated in FIG. 3 are of a "mezzanine" architecture in which the boards are "stacked" on top of each other inside the docking station. In the illustrated embodiment, the architecture of the modules 80 may be what is referred to as a PC/104 or PC/104+ architecture. This architecture is Illustrated in FIGS. 4A and 4B.

Figure 4A:
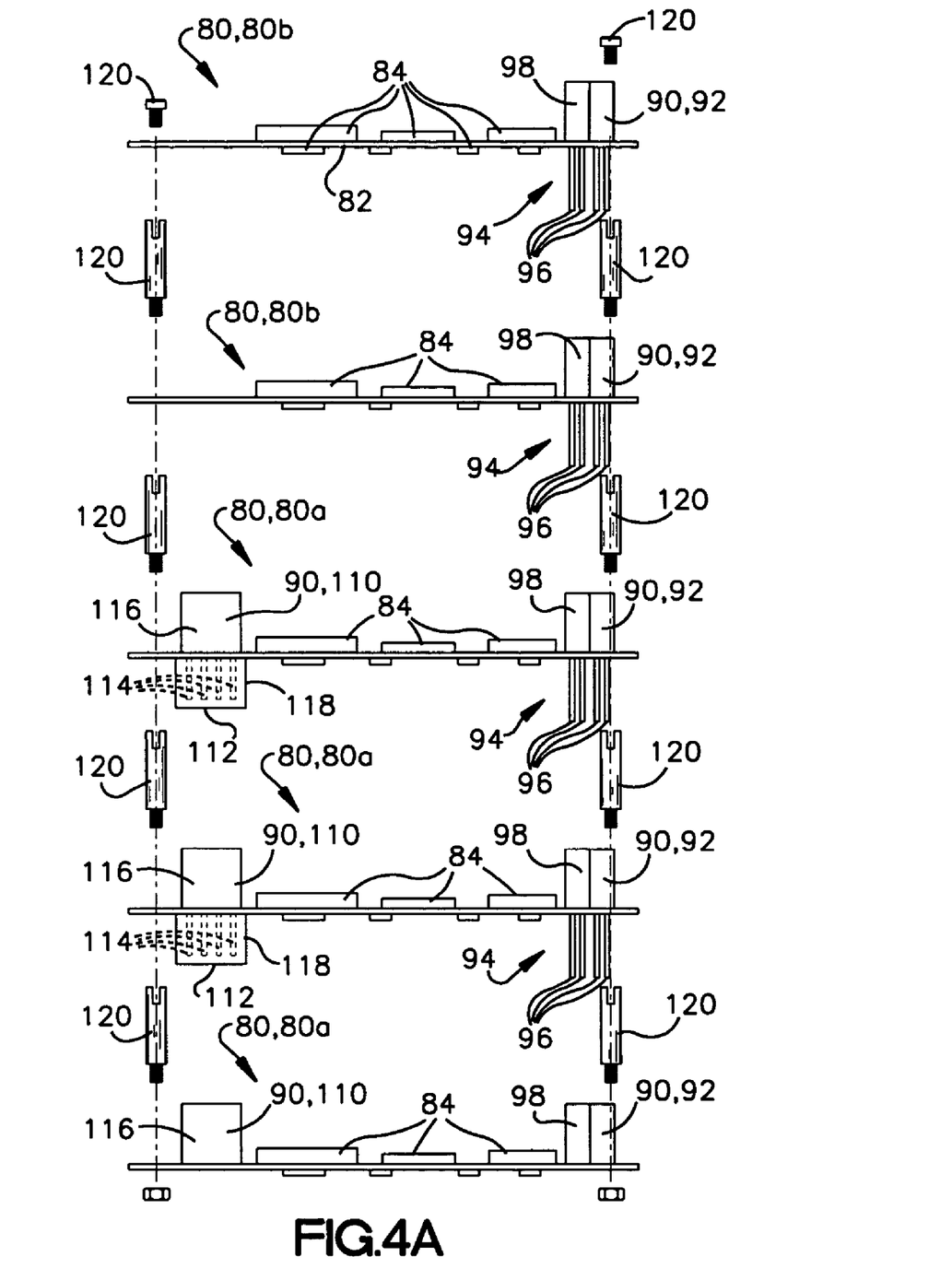
FIG. 4A is an exploded view of a module stack portion of the docking station of FIG. 3.
Figure 4B:
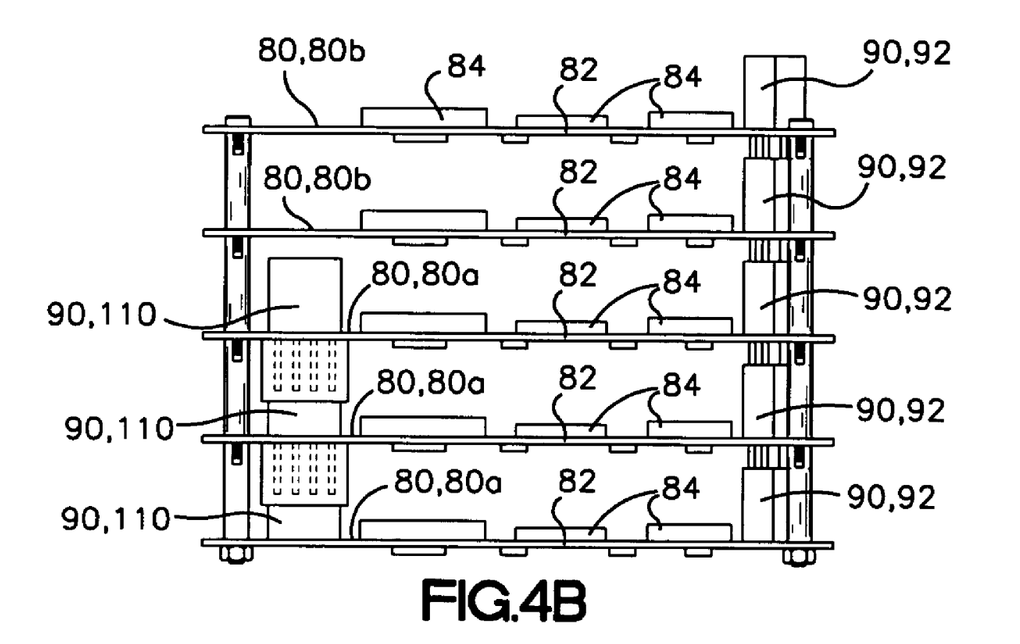
FIG. 4B illustrates the module stack of FIG. 4A in an assembled condition.

Referring to FIGS. 4A and 4B, according to the PC/104 architecture, the modules 80 follow a standard form factor. Each module 80 includes a circuit board 82 upon which the task specific components 84 of each particular module are mounted. According to the PC/104 form factor, the modules 80 have a compact 3.6×3.8 inch footprint. I/O connections are restricted to a limited space on lateral sides of the modules 80.

Characteristic of the PC/104 architecture, the modules 80 include stacking connectors 90 that form an expandable bus or busses for the modules. The bus or busses may provide I/O and communication between the modules 80 and power for operating the modules 80. Depending on the performance requirements, the modules 80 may include an ISA bus (PC/104) or an ISA bus and a PCI bus (PC/104-plus). In the configuration shown in FIGS. 4A and 4B, the modules 80 include three PC/104-plus modules, indicated at 80*a*, that include both ISA and PCI bus capabilities, and two PC/104 modules, indicated at 80*b*, that include only ISA bus capabilities. The modules 80*a* include connectors 92 that form an ISA bus and connectors 110 that form a PCI bus. The modules 80b include only ISA connectors 92.

The ISA connectors 92 are typically 104-pin connectors that may be formed, for example, by combining a 64-pin connector and a 40-pin connector. The ISA connectors 92 each have a lower portion 94 that includes pins 96 which project from a lower surface of the circuit board 82, and an upper portion 98 that includes a receptacle that corresponds to each pin. The upper portion 98 of the ISA connector 92 for each module 80 receives the pins 96 of the lower portion of the ISA connector for the module positioned directly above. The ISA bus of the stacked modules 80 thus expands as the modules are stacked and the ISA connectors 92 are interconnected.

The PCI connectors 110 are typically 120-pin stack-through connectors. The PCI connectors 110 each have a lower portion 112 that includes pins 114 which project from a lower surface of the circuit board 82, and an upper portion 116 that includes a receptacle that corresponds to each pin. The PCI connectors 110 may include a shroud 118 that surrounds the pins 114. The upper portion 116 of the PCI connector 110 for each module 80a receives the pins 114 of the lower portion of the PCI connector for the module positioned directly above. The PCI bus of the stacked modules 80a thus expands as the modules are stacked and the PCI connectors 110 are interconnected.

The modules 80 in the stack are mechanically connected or fastened with each other via connectors 120 which also space the modules. In the embodiment illustrated in FIGS. 4A and 4B, the connectors 120 include a post portion for spacing the modules 80, an externally threaded lower portion extendable through the circuit board 82, and an internally threaded upper portion for receiving the threaded portion of the connector of the module positioned directly above. In the illustrated embodiment, the lowermost module 80, sometimes referred to as a "host board," may not include the lower portions of its ATI connector 92 and PCI connector 110 to facilitate mounting the module on a surface.

Figure 5:
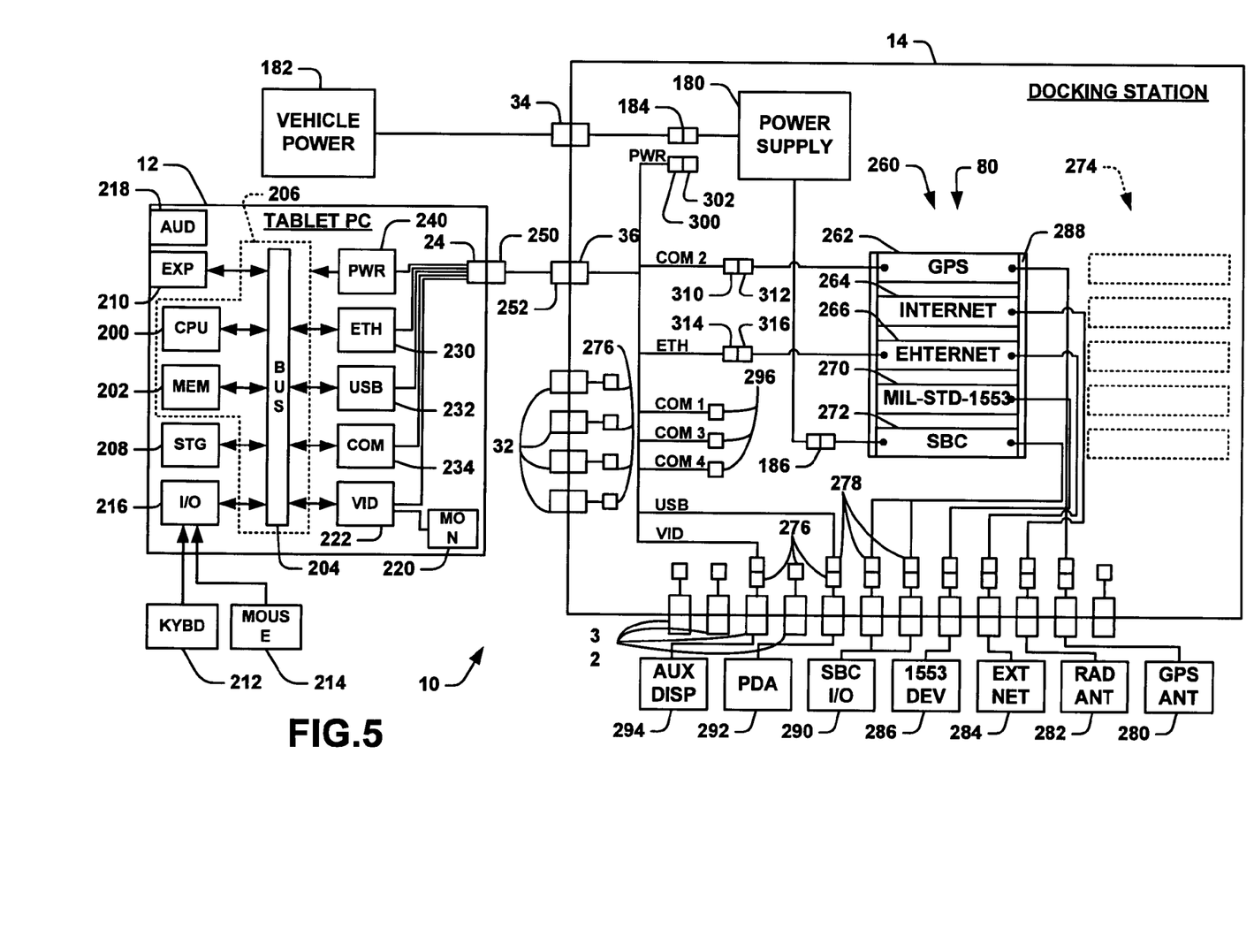
FIG. 5 is a functional block diagram illustrating an example configuration of the computer system with a configurable docking station, according to an embodiment of the present invention.

The modules 80 in the stack may have a variety of configurations and/or perform a variety of functions. The modules 80 may communicate or provide I/O to other modules via the ISA or PCI bus, or they could act as standalone modules. The modules 80 may be COTS modules that perform a standard functionality or could be custom modules that provide a specific functionality. For example, a module 80 may be a single board computer (SBC) that is a stand-alone computer complete with processing, storage, memory and communication (e.g., COM, Ethernet, Internet) capabilities. As another example, a module 80 may be an Ethernet board for providing networking capabilities. As further examples, the modules 80 may also serve any of the following functions:

Global Positioning System (GPS) functionality
IEEE 1394 Firewire communications
RS-232 I/O
RS-422 I/O
RS-485 I/O
MIL-STD-1553 bus
USB I/O
Internet connectivity
Modem communications
Wireless LAN
Radio communications
Video (e.g., SVGA)
Voice activation software/hardware
Biometrics activation software/hardware
Dismountable equipment interface (e.g., hand-held computers)
Sensor interface The system 10 of the present invention will be better understood in view of FIG. 5, which illustrates an example configuration of the computer 12 and docking station 14 interconnected by the cable 16. As shown in FIG. 5, the computer 12 is a tablet PC. Because not all users have the same needs, however, the computer 12 may comprise a variety of computing platforms adapted for implementation in the system 10 of the present invention. The particular type of computer 12 may be selected based on the functionality and utility required by the users to best perform their mission.

For example, a user with a minimal set of needs may need only a simple display for accessing, for example, a route map, and the ability to receive messages. In this instance, a mini-tablet PC may suffice for the computer 12. In this implementation, a relatively small display (e.g., 8-inches diagonal) with standard resolution (e.g., 256 color VGA) may be adequate. The mini-tablet could connect to the docking station 14 through a standard interface, such as Ethernet.

As another example, a user with a more complex set of needs may require a computer 12 in the form of a notebook PC that may perform integrated functions with the modules 80 of the docking station 14 and localized functions on the notebook PC while connected or disconnected from the docking station. In this configuration, the platform (e.g., vehicle) in which the system 10 is installed may include a notebook station equipped with a display terminal and keyboard. This approach may be similar to using a notebook computer in an office environment with a separate display and keyboard.

As another example, a handheld computer could provide reduced functionality and a smaller display than a minitablet, yet it could be integrated through a mounting bracket and cable to the docking station. The handheld computer could also be provided in a dismounted version with its own GPS and wireless hardware. Wireless capabilities could range from a personal-area network to a wide-area network.

In the embodiment of FIG. 5, the computer 12 includes a central processing unit (CPU) 200, a system memory 202, and a system bus 204 mounted on a motherboard 206. The bus 204 couples various system components including the system memory 202 to the processing unit 200. The processing unit 200 may be any commercially available or proprietary processor. In addition, the processing unit 200 may be implemented as multi-processor formed of more than one processor which may, for example, be connected in parallel.

The system bus 204 may be any of several types of bus structure including a memory bus or memory controller, a peripheral bus, and a local bus using any of a variety of conventional bus architectures, such as PCI, VESA, Microchannel, ISA, and EISA, to name a few. The system memory 202 may include read only memory (ROM) and random access memory (RAM). A basic input/output system (BIOS), containing the basic routines that help to transfer information between elements within the computer 12, such as during start-up, is stored in ROM.

The computer 12 also may include a data storage medium 208, such as a hard (magnetic) disk drive or a solid state disk (SSD). An SSD may be preferred due to its superior ability to withstand shock over a conventional magnetic hard disk. The computer 12 may also include an expansion slot 210, which may be used to provide access to devices such as removable storage media or communication devices, and an audio output port 218.

A user may enter commands and information into the computer 12 through one or more user input devices, such as a keyboard 212 and a pointing device (e.g., a mouse 214). Other input devices (not shown) may include a track ball, touch pad, stylus, touch screen, voice recognition device, or the like. These and other input devices are often connected to the processing unit 200 through a communication I/O port interface 216, such as a serial port, that is coupled to the system bus 204, but may be connected by other interfaces, such as a parallel port or a universal serial bus (USB). A monitor 220 or other type of display device is also connected to the system bus 204 via an interface, such as a video adapter 222. In addition to the monitor 220, the computer 12 may include other peripheral output devices (not shown), such as speakers.

The computer 12 may include a variety of I/O devices for providing access to external I/O data via the bus 204. For example, the computer 12 may include an Ethernet port 230, universal serial bus (USB) port(s) 232, and serial (COM) port(s) 234. These devices may be in the form of cards or adapters installed in the computer 12 and operatively connected to the motherboard 206 and/or bus 204. Alternatively, these devices may comprise circuits on the motherboard 206 and components mounted directly on the motherboard.

The computer 12 also includes a power supply 240 for providing electrical power to the various components of the computer. In the embodiment illustrated in FIG. 5, the power supply 240 provides electrical power to the motherboard 206, which distributes power to the various components of the computer 12.

The docking station 14 includes a power supply 180 that provides electrical power to the modules 80 of the docking station. As will be discussed below, the power supply 180 also provides power to the computer 12 via the cable 16. The power supply 180 is electrically connected to an external power source, such as vehicle power 182, via the power connector 34. The power supply 180 may be connected to the power connector 34 via a connector 184, such as a Molex connector, so as to provide a quick disconnect for installation, removal, and replacement of the power supply. The power supply 180 may also be connected to the modules 80 via a connector 186 so as to provide a quick disconnect for installation, removal, and replacement of the modules. As shown in FIG. 5, the power supply 180 provides electrical power to a single module. The power may then be distributed to the other modules through the bus or via other interconnections between the modules. It will be appreciated, however, that the power supply 180 may provide electrical power directly to more than one or all of the modules 80.

According to the present invention, I/O connections in the form of conductors (e.g., cables, wires, circuit board traces, etc.) of the video adapter 222, Ethernet port 230, USB ports 232, and COM ports 234 are grouped together with conductors of the power supply 140 and electrically connected to the connector 24 of the computer 12. The cable 16 includes a first end with a first connector 250 adapted to mate with the connector 24 of the computer 12 and a second end with a second connector 252 adapted to mate with the connector 36 of the docking station. The cable 16 may thus provide power to the computer 12 from the docking station 14 as well as communication between the computer and the docking station. The connectors 24, 36, 250, and 252 may have a variety of configurations. In one example, the connectors 24, 36, 250, and 252 may be 57-pin connectors and, therefore, the cable 16 may include 57 wires or conductors for providing power to the computer 12 and communication between the computer and the docking station 14. In this example configuration, the wires or conductors of the cable 16 may be assigned to the connectors as shown in the following table:

TABLE 1-1

| PIN NO. | SIGNAL | PIN NO. | SIGNAL | FUNCTION |
| --- | --- | --- | --- | --- |
| 1 SB 25 | Red | 2 SB 27 | Green | SVGA |
| 3 SB 29 | Blue | 4 SB 32 | Hsync | SVGA |
| 5 SB 26 | Gnd (red) | 6 SB 28 | Gnd (green) | SVGA |
| 7 SB 30 | Gnd (blue) | 8 SB 31 | Not used | SVGA |
| 9 SB 34 | Vsync | 10 SB 33 | Gnd (Hsync) | SVGA |
| 11 SB 12 | Eth-TX+ | 12 SB 13 | Eth-TX− | Ethernet |
| 13 SB 21 | Eth-RX+ | 14 SB 22 | Eth-RX− | Ethernet |
| 15 SB 14 | Not used | 16 SB 35 | Gnd (Vsync) | SVGA |
| 17 SB 15 | Not used | 18 SB 24 | Not used | Spare |
| 19 SB 23 | Not used | 20 SB 16 | Not used | Spare |
| 21 SB 17 | Vcc (USB) | 22 SB 19 | USB port− | USB |
| 23 SB 18 | USB port+ | 24 SB 20 | Gnd (USB) | USB |
| 25 SB 39 | Gnd (L1) | 26 SB 37 | L1-TX (RS-232) | COM 1–4 |
| 27 SB 38 | L1-RX (RS-232) | 28 SB 42 | Gnd (L2) | COM 1–4 |
| 29 SB 40 | L2-TX+ (RS-422) | 30 SB 41 | L2-TX− (RS-422) | COM 1–4 |
| 31 SB 47 | L2-RX+ (RS-422) | 32 SB 48 | L2-RX− (RS-422) | COM 1–4 |
| 33 SB 36 | Not used | 34 SB 46 | Gnd (L3) | COM 1–4 |
| 35 SB 44 | L3-TX+ (RS-422) | 36 SB 45 | L3-TX− (RS-422) | COM 1–4 |
| 37 SB 51 | L3-RX+ (RS-422) | 38 SB 52 | L3-RX− (RS-422) | COM 1–4 |
| 39 SB 43 | Not used | 40 SB 56 | Gnd (L4) | COM 1–4 |
| 41 SB 53 | L4-TX+ (RS-422) | 42 SB 54 | L4-TX− (RS-422) | COM 1–4 |
| 43 SB 49 | L4-RX+ (RS-422) | 44 SB 50 | L4-RX− (RS-422) | COM 1–4 |
| 45 SB 3 | Power− | 46 SB 5 | Power− | Power |
| 47 SB 7 | Power− | 48 SB 2 | Power+ | Power |
| 49 SB 1 | Chassis Ground | 50 SB 9 | Power− | Power |
| 51 SB 11 | Power− | 52 SB 4 | Power+ | Power |
| 53 SB 6 | Power+ | 54 SB 6 | Power+ | Power |
| 55 SB 10 | Power+ | | | Power |

It will be appreciated, of course, that the wires or conductors of the cable 16 may be assigned to the connectors in a variety of manners.

The example docking station 14 of FIG. 5 includes a module stack 260. The module stack 260 includes a GPS module 262, a radio internet module 264, an Ethernet module 266, a MIL-STD-1553 bus module 270, and a single board computer (SBC) module 272. Spare module stack space in the docking station 14 is represented at 274. Characteristic of the PC/104 architecture described above, depending on the construction of the modules in the stack 260, the modules may communicate with each other via a bus 288 formed by stacked connectors of the modules. For example, the GPS module 262 may be a standalone module that communicates with the computer 12 via COM 2 of the communication module 234. The radio internet module 264, Ethernet module 266, MIL-STD-1553 bus module 270, and SBC module 272 may communicate with each other via the bus 288 and, in this instance, the computer 12 may communicate with these modules via an Ethernet connection. It will be appreciated that, in this configuration, the computer 12 and the SBC module 272 may form a client-server architecture through the Ethernet connections facilitated through the Ethernet module 266. Alternatively, the SBC module 272 could be a standalone module that does not communicate with the computer 12. In this instance, the SBC module 272 may be implemented to communicate with external devices through I/O ports (e.g., COM ports) of the SBC module.

To facilitate quick and efficient addition of modules to the docking station, each I/O port 32 of the docking station may be fit internally with wires or a cable terminated with a connector 276. The connectors 276 may be standard electrical connectors, such as Molex connectors, which may be well-known and readily obtainable. The ports 32 may be terminated with the connectors 276 regardless of whether the port is intended for use in a particular configuration of the system 10. Because of this, modules implemented in the docking station 14 that require an external connection may be connected with a I/O port 32 using a connector 278 that mates with the connector 276. All of the pins for each I/O port 32 may be wired to the connector 276. This way, a mating connector 278 for a device in the docking station 14, e.g., a module 80, may be wired in order to select the appropriate pins of the I/O port so that the proper connection is made with an external device connected to the I/O port.

In the example configuration of FIG. 5, the modules of the stack 260 are connected with external devices via the ports 32 through the connectors 276 and 278. The GPS module 262 is connected to a GPS antenna 280 via one of the ports 32. The radio internet module 264 is connected to a radio antenna 282 via one of the ports 32. The Ethernet module 266 is connected to an external network 284 via one of the ports 32. The MIL-STD-1553 bus module 270 is connected to a MIL-STD-1553 device 286 via one of the ports 32. The SBC module 272 is connected to external I/O devices 290 via one of the ports 32.

The connectors 276 connected with the ports 32 may also facilitate connections between the computer 12 and devices external to the computer and docking station. In the example configuration of FIG. 5, a USB port 232 of the computer 12 is connected with a personal digital assistant (PDA) device 292 via a USB connection facilitated through an I/O port 32 of the docking station 14. As shown in FIG. 5, the USB port 232 is wired to the connector 24 of the computer 12 which is connected to the port 36 of the docking station 14 via the cable 16. Inside the docking station 14, the pins of the port 36 associated with the USB port 232 of the computer 12 are wired to a connector 278, which is connected to a connector 276 to thereby allow for connection of the PDA 292 to the USB port via the I/O port 32.

Also, as shown in FIG. 5, the video adapter 222 of the computer 12 is connected to an auxiliary display 294 via a I/O port 32 of the docking station 14. As shown in FIG. 5, the video adapter 222 is wired to the connector 24 of the computer 12 which is connected to the port 36 of the docking station 14 via the cable 16. Inside the docking station 14, the pins of the port 36 associated with the video adapter 222 are wired to a connector 278, which is connected to a connector 276 to thereby allow for connection of the auxiliary display 294 to the video adapter via the I/O port 32.

To facilitate quick and efficient connection of the COM ports 234 of the computer 12 to either modules 80 in the docking station 14 or devices external to the computer and docking station, pins of the port 36 associated with the COM ports may be wired to connectors 278. In the example configuration of FIG. 5, COM ports 1, 3, and 4 are wired to connectors 296. In this configuration, an external device may be connected to any of COM ports 1, 3, and 4 by connecting the device to an I/O port 32 and connecting the connector 296 to the connector 276 associated with the I/O port.

Connections with the modules in the stack 260 and with other devices in the docking station 14 may also be facilitated through the implementation of standard electrical connectors, such as Molex connectors. For example, in the docking station 14, the pins of the port 36 associated with the power supply 240 of the computer 12 may be wired to a connector 300, which is connected to a mating connector 302 to thereby allow for connection with the power supply 180 of the docking station. The docking station 14 may thus provide power for powering and/or charging the power supply 240 of the computer 12. Similarly, the pins of the port 36 associated with the COM 2 port 234 of the computer 12 may be wired to a connector 310, which is connected to a mating connector 312 to thereby allow for connection with the GPS module 262 in the docking station 14. Also, the pins of the port 36 associated with the Ethernet port 230 of the computer 12 may be wired to a connector 314, which is connected to a mating connector 316 to thereby allow for connection with the Ethernet module 266 in the docking station 14.

It will be appreciated that the connector configuration of the docking station 14 will thus provide a versatile means by which to interconnect components of the computer 12 with peripheral devices, i.e., modules 80 in the docking station and with devices external to the docking station. It will also be appreciated that the configuration of the system may be re-configured easily, simply by rearranging the connectors inside the docking station 14. For example, in the system 10 of FIG. 5, the GPS module could be connected with an alternative COM port 234 (i.e., COM 1, 3, or 4) simply by connecting the connector 312 with the connector 296 of the desired COM port. As another example, any of the devices external to the computer 12 and docking station 14 could be relocated to a different I/O port 32 simply by connecting the external device to that I/O port and reconfiguring the appropriate connectors 276 and 278.

It will also be appreciated that the present invention also allows for replacement of the computer 12 and components of the docking station 14. This need may arise, for example, as a result of component failure or technology migration. As technology for the computer 12 improves, the computer may be replaced simply by plugging a new unit into the system 10 via the cable 16. As technology the modules in the module stack 260 improves, the modules may be replaced simply by placing the new module in the stack and rearranging the appropriate connectors in the docking station 14.

The present invention thus provides a versatile computer system with a re-configurable docking station in which the computer 12 is connected to the docking station 14 via a single cable 16 that provides power to the computer and also provides I/O connections between the computer and devices in the docking station. The docking station 14 may also facilitate communication between the computer 12 and devices external to the docking station via the cable 16. The connections in the docking station 14 are highly re-configurable to provide a desired communication path between the computer 12 and the devices in the docking station and external to the docking station.

Figure 6:
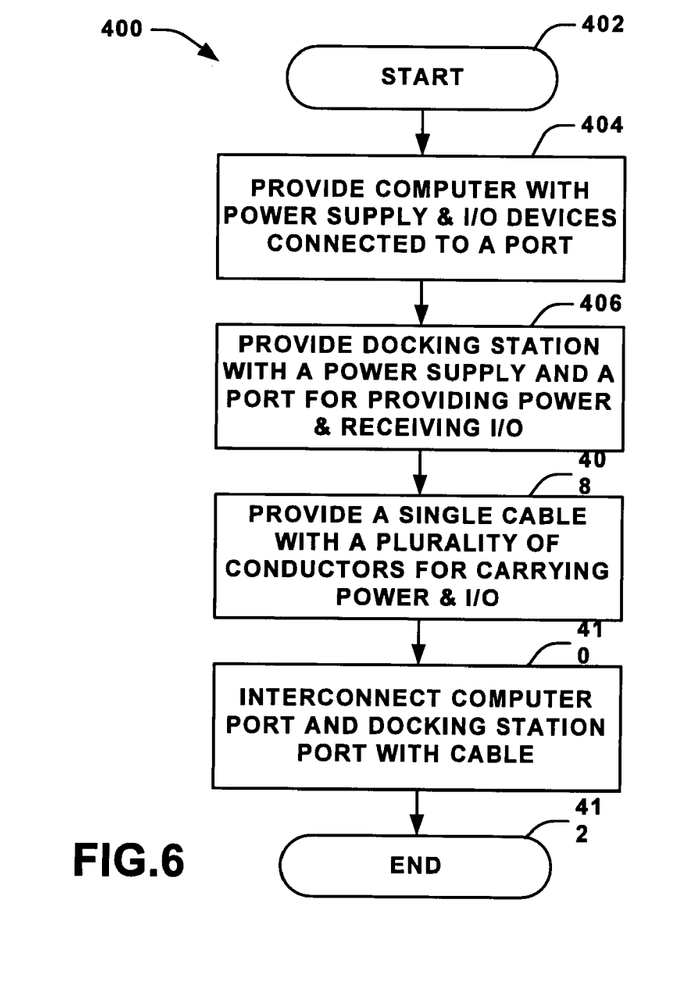
FIGS. 6–8 are flow diagrams illustrating methodologies for implementing the system of FIGS. 1–5, according to embodiments of the present invention.
Figure 7:
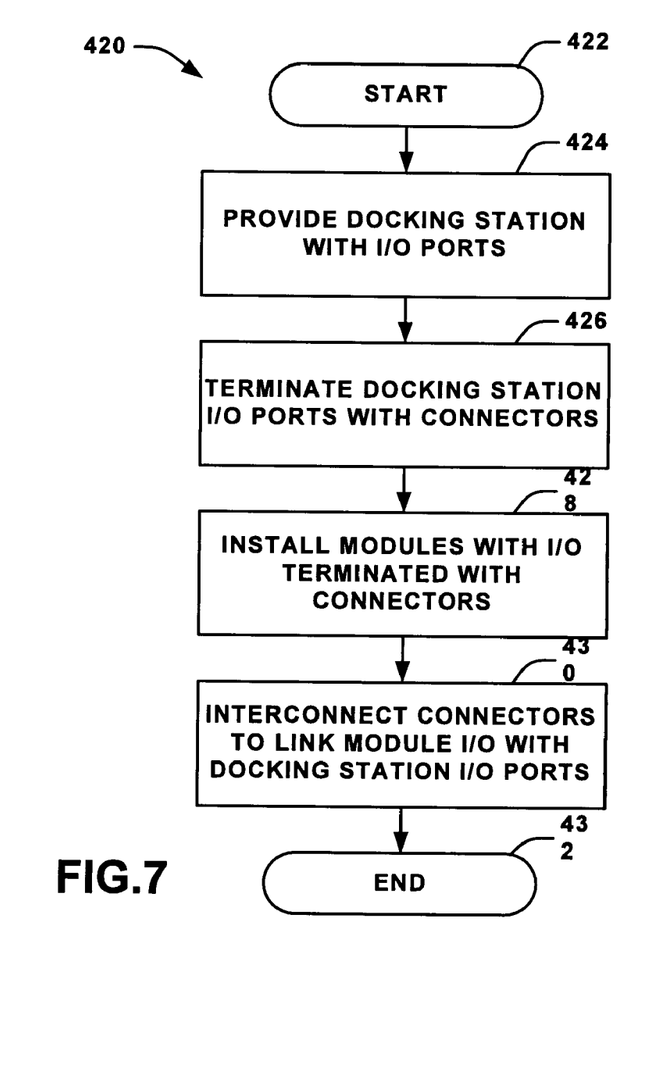
Figure 8:
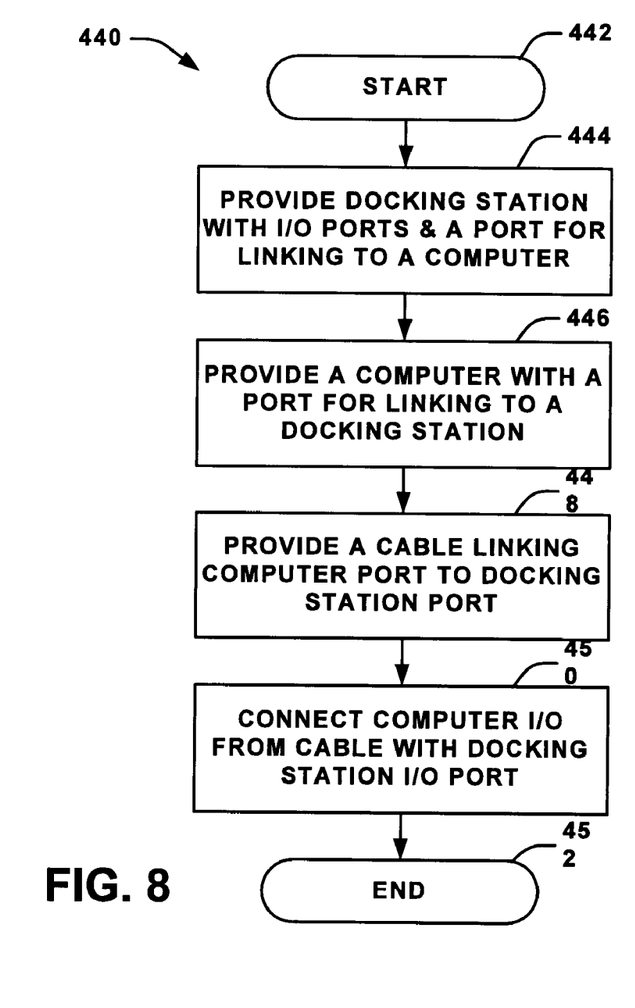

FIGS. 6–8 illustrate exemplary methodologies for configuring the system 10 in accordance with aspects of the present invention. While, for purposes of simplicity of explanation, the methodologies of FIGS. 6–8 are shown and described as being implemented serially, it is to be understood and appreciated that the present invention is not limited to the illustrated order, as some aspects could, in accordance with the present invention, occur in different orders and/or concurrently with other aspects from that shown and described. Moreover, not all illustrated features may be required to implement the methodologies in accordance with an aspect of the present invention.

Referring to the methodology 400 of FIG. 6 with reference to FIG. 5, the methodology begins at 402, and proceeds to 404, where the computer 12 is provided. The computer 12 includes the power supply 240 and I/O devices in the form of the Ethernet adapter 230, USB ports 232, COM ports 234, and video adapter 222. The power supply and I/O devices are operatively connected to a port 24 of the computer 12. Next, at 406, the docking station 14 is provided. The docking station 14 includes a port 36 for providing electrical power and receiving I/O. Next, at 408, the cable 16 is provided. The cable 16 includes a plurality of conductors for carrying electrical power and I/O. Next, at 410, the port 24 of the computer 12 is connected with the port 36 of the docking station 14 via the cable 16. The docking station 14 may thus provide electrical power to the computer 12 and receive I/O signals from the computer via the cable 16. Conversely, the computer 12 may receive electrical power and I/O signals from the docking station 14. The methodology 400 ends at 412.

It will thus be appreciated that, through the methodology 400 of FIG. 6, the computer 12 may be operatively connected with the docking station 14 by the cable 16. Because of this, the computer 12 may receive electrical power from the power supply 180 of the docking station 14, which may power the power supply 240 of the computer and thereby facilitate operation of the components of the computer. Also, through this connection, I/O signals may be passed between the computer 12 and the modules 80 of the docking station 14 to facilitate remote access to the modules 80 through the computer.

Referring to the methodology 420 of FIG. 7 with reference to FIG. 5, the methodology begins at 422, and proceeds to 424, where the docking station 14 is provided. The docking station 14 includes the I/O ports 32. Next, at 426, the I/O ports 32 of the docking station 14 are terminated with the connectors 276. Next, at 428, the modules 80 are installed and the I/O of the modules is terminated with the connectors 278. Next, at 430, the connectors 278 of the modules 80 are interconnected with the connectors 276 of the I/O ports 32. This links the I/O of the modules 80 to the I/O ports 32 of the docking station 14 and thereby facilitates communication with external devices through the ports. The methodology 420 ends at 432.

It will thus be appreciated that, through the methodology 420 of FIG. 7, the modules 80 mounted in the docking station 14 may be operatively connected with external I/O through the I/O ports 32 of the docking station 14. Because the I/O ports 32 and the I/O of the modules 80 are terminated with standard or mating connectors 276 and 278, respectively, the modules 80 in the docking station may be reconfigured, i.e., re-arranged, added, removed, etc., in a quick and efficient manner. This also facilitates reconfiguring I/O port 32 through which the module 80 communicates by permitting the I/O port to be selected simply by connecting the module I/O connector 278 to the appropriate I/O port connector 276.

Referring to the methodology 440 of FIG. 8 with reference to FIG. 5, the methodology begins at 442, and proceeds to 444, where the docking station 14 is provided. The docking station 14 includes I/O ports 32 and a port 36 for linking the docking station to a computer. Next, at 446, the computer 12 is provided. The computer 12 includes a port 24 for linking to a docking station. Next, at 448, the cable 16 is provided. The cable 16 links the port 36 of the docking station 14 to the port 24 of the computer 12. Next, at 450, I/O of the computer 12 is linked to the I/O port(s) 32 of the docking station 14. This is done by connecting conductors of the cable 16 associated with the computer I/O to the connector(s) 276 of the I/O port(s) 32. As a result, I/O of the computer 12 may be accessed directly through the I/O port(s) 32 without involving the modules 80 (see, for example, the video connection in the docking station of FIG. 5). The methodology 440 ends at 452.

It will thus be appreciated that, through the methodology 440 of FIG. 8, the docking station 14 may act as a remote location for interfacing with I/O of the computer 12. Through the incorporation of the cable 16 connecting the computer 12 and the docking station 14 via the ports 24 and 36, reconfiguration of the computer itself to accommodate various types of I/O may be eliminated or reduced. The docking station 14, being fitted with plural I/O ports 32 terminated internally with the connectors 276, readily facilitates rapid and easy configuration to provide the desired I/O connection(s) with the computer 12.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. For example, the present invention may not be limited to a mobile computer system and could be implemented in a stationary environment/platform. Accordingly, the present invention is intended to embrace all such alterations, modifications and variations that fall within the spirit and scope of the appended claims.

What is claimed is:

1. A system comprising:
    a computer having at least one power input connection and at least one I/O connection grouped into a first port;
    a docking station having at least one power output connection and at least one I/O connection grouped into a second port;

a cable having a first end connectable with the first port and a second end connectable with the second port, the cable providing an interconnection between the at least one power output connection of the docking station and the at least one power input connection of the computer, the cable providing interconnection between the at least one I/O connection of the computer and the at least one I/O connection of the docking station; and at least one module mountable in the docking station, the docking station comprising at least one I/O port connectable with I/O connections of the at least one module to provide communication between the at least one module and at least one device external to the docking station;

the at least one module comprising at least one of GPS modules, IEEE 1394 Firewire communications modules, RS-232 I/O modules, RS-422 I/O modules, RS-485 I/O modules, MIL-STD-1553 bus modules, USB I/O modules, internet modules, modem communication modules, wireless LAN modules, radio communication modules, video modules, voice activation modules, biometrics activation modules, dismountable equipment interface modules, and sensor interface modules.

2. The system of claim 1, the computer comprising a first power supply and the docking station comprising a second power supply, the second power supply providing electrical power to the first power supply through the cable.

3. The system of claim 1, the power output connections and I/O connections of the docking station comprising conductors having first ends grouped together at the second port, the conductors having opposite second ends terminated with electrical connectors.

4. The system of claim 1, the I/O connections of the docking station comprising conductors having first ends grouped together at the second port, the conductors having opposite second ends connectable with the I/O connections of the at least one module to provide communication between the at least one module and the computer via the cable.

5. The system of claim 1, wherein said at least one module comprises a plurality of modules that form a module stack mountable in the docking station, the modules in the module stack being interconnected to form a communication bus for providing communications between the modules.

6. The system of claim 1, the computer communicating with the at least one module in the docking station via the cable through at least one of Ethernet, USB, RS-232, RS-422, and RS-485 communications.

7. The system of claim 1, the docking station comprising at least one I/O port, the I/O connections of the docking station comprising conductors having first ends grouped together at the second port, the conductors having opposite second ends connectable with the at least one I/O port to provide a connection between the I/O connections of the computer and the at least one I/O port via the cable.

8. The system of claim 3, the electrical connectors grouping the second ends of the conductors of the docking station I/O connections to correspond with the I/O connections of the computer.

9. The system of claim 5, wherein the communication bus of the module stack is formed through interconnection of bus connectors of adjacent modules, the module stack being expandable through stacking additional boards onto the stack, the communication bus being expandable by interconnecting the bus connectors of the added modules to the bus connectors of adjacent modules in the module stack.

10. The system of claim 7, the second ends of the conductors being arranged in groups to correspond with the different types of I/O connections of the computer, the groups of second ends each being connectable with the at least one I/O port to provide a connection between an I/O connections of the computer and the I/O ports of the docking station.

11. The system of claim 9, the modules comprise PC/104 modules.

12. The system of claim 10, each of the groups of second ends being terminated with an electrical connector, the I/O ports of the docking station each being terminated with electrical connectors, the electrical connectors of the groups of second ends being connectable with the electrical connectors of the I/O ports to provide connections between the docking station conductors and the I/O ports.

13. A system comprising:
a docking station including a plurality of I/O ports, each I/O port being terminated with an I/O port connector;
at least one module supported in the docking station, the at least one module having I/O connections terminated with module I/O connectors, the module I/O connectors being connectable with a selected one of the I/O port connectors to configure the module I/O connections to communicate through the selected I/O port; and
a computer including a power input connection and at least one I/O connection grouped into a first port, the docking station having a power output connection, at least one of the module I/O connections and the power output connection being grouped into a second port, the system further comprising a cable having a first end connectable with the first port and a second end connectable with the second port, the cable providing an interconnection between the power output connection of the docking station and the power input connection of the computer, the cable providing interconnection between the at least one I/O connection of the computer and the at least one of the module I/O connections.

14. The system of claim 13, the I/O ports each including a plurality of conductors for transmitting I/O signals, each of the conductors being wired to its associated I/O port connector, the module I/O connections being selectively wired to the module I/O connectors to provide a desired communication path with an external device connected with the I/O port.

15. The system of claim 13, wherein said at least one module comprises a plurality of modules that form a module stack mountable in the docking station, the modules in the module stack being interconnected to form a communication bus for providing communications between the modules.

16. The system of claim 13, the computer communicating with the at least one module in the docking station via the cable through at least one of Ethernet, USB, RS-232, RS-422, and RS-485 communications.

17. The system of claim 15, wherein the communication bus of the module stack is formed through interconnection of bus connectors of adjacent modules, the module stack being expandable through stacking additional boards onto the stack, the communication bus being expandable by interconnecting the bus connectors of the added modules to the bus connectors of adjacent modules in the module stack.

18. A system comprising:
a computer having at least one I/O connection provided to a first port;
a docking station having a second port and at least one I/O port;

a cable having a first end connectable with the first port and a second end connectable with the second port, the cable providing an interconnection between the at least one I/O connection of the computer and the second port of the docking station;

a connector for providing interconnection between the second port and a selected I/O port of the docking station to provide I/O from an external device connected to the selected I/O port to the at least one I/O connection of the computer via the cable; and a plurality of modules that form a module stack mountable in the docking station, the modules in the module stack being interconnected to form a communication bus for providing communications between the modules, the at least one I/O port of the docking station being connectable with I/O connections of at least one of the modules in the module stack to provide communication between the at least one module and at least one device external to the docking station.

19. The system of claim 18, the docking station I/O ports each including a plurality of conductors for transmitting I/O signals, each of the conductors being wired to an I/O port connector associated with the I/O port, the second port of the docking station including a plurality of conductors for transmitting I/O signals from the cable, the conductors of the second port being wired to second port connectors, the second port connectors being connectable with the I/O port connectors to provide an I/O path from an I/O port to an I/O connection of the computer via the cable.

20. A method for configuring a computer system comprising the steps of:

providing a computer having a power input connection and at least one I/O connection grouping the power input connection and I/O connections of the computer into a first port;

providing a docking station having a power output connection and at least one I/O connection, the at least one I/O connection comprising at least one conductor;

grouping the power output connection and I/O connections of the docking station into a second port;

connecting a first end of a cable with the first port of the computer;

connecting a second end of the cable with the second port of the docking station, the cable providing an interconnection between the power output connection of the docking station and the power input connection of the computer, the cable providing interconnection between the at least one I/O connection of the computer and the at least one I/O connection of the docking station;

providing at least one module mountable in the docking station;

providing the docking station with at least one I/O port connectable with I/O connections of the at least one module to provide communication between the at least one module and at least one device external to the docking station;

grouping first ends of the conductors at the second port; and connecting second ends of the conductors with the I/O connections of the at least one module to provide communication between the at least one module and the computer via the cable.

21. The method of claim 20, the power output connections and I/O connections of the docking station comprising conductors, the method further comprising the steps of grouping first ends of the conductors at the second port and terminating second ends of the conductors with electrical connectors to correspond with different types of the I/O connections of the computer.

22. The method of claim 20, wherein step of providing at least one module comprises providing a plurality of modules configured in a module stack, the method further comprising the steps of interconnecting bus connectors of adjacent modules to form a communication bus of the module stack.

23. The method of claim 20, further comprising the step of providing communication between the computer and the at least one module in the docking station via the cable through at least one of Ethernet, USB, RS-232, RS-422, and RS-485 communications.

24. The method of claim 22, further comprising the steps of stacking additional boards on the module stack to expand the module stack, and interconnecting the bus connectors of the added modules to the bus connectors of adjacent modules in the module stack to expand the communication bus of the module stack.

25. A method for configuring a computer system comprising the steps of:

providing a computer having at least one I/O connection linked to a first port;

providing a docking station having a second port and at least one I/O port;

connecting a first end of a cable with the first port;

connecting a second end of the cable with the second port to provide an interconnection between the at least one I/O connection of the computer and the second port of the docking station;

interconnecting the second port and a selected I/O port of the docking station with a connector to provide I/O from an external device connected to the selected I/O port to the at least one I/O connection of the computer via the cable;

providing a plurality of modules that form a module stack mountable in the docking station, the modules in the module stack being interconnected to form a communication bus for providing communications between the modules; and connecting the at least one I/O port of the docking station with I/O connections of at least one of the modules in the module stack to provide communication between the at least one module and at least one device external to the docking station.

26. The method of claim 25, the docking station I/O ports each including a plurality of conductors for transmitting I/O signals, the second port of the docking station including a plurality of conductors for transmitting I/O signals from the cable, the method further comprising the steps of:

wiring each of the conductors to an I/O port connector associated with the I/O port;

wiring the conductors of the second port to second port connectors; and connecting the second port connectors with the I/O port connectors to configure an I/O path from an I/O port to an I/O connection of the computer via the cable.

* * * * *